US008518717B2

(12) United States Patent
Zheng et al.

(10) Patent No.: US 8,518,717 B2
(45) Date of Patent: Aug. 27, 2013

(54) METHOD FOR JUNCTION ISOLATION TO REDUCE JUNCTION DAMAGE FOR A TMR SENSOR

(75) Inventors: Gao Zheng, San Jose, CA (US); Hong Liubo, San Jose, CA (US); Hsiao Richard, San Jose, CA (US); Ju Kochan, Monte Sereno, CA (US); Maat Stephen, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 110 days.

(21) Appl. No.: 12/979,055

(22) Filed: Dec. 27, 2010

(65) Prior Publication Data

US 2012/0164757 A1 Jun. 28, 2012

(51) Int. Cl.
*H01L 21/00* (2006.01)

(52) U.S. Cl.
USPC ............................................. 438/3; 257/E21

(58) Field of Classification Search
USPC ..................... 438/3; 257/E21.003
See application file for complete search history.

(56) References Cited

U.S. PATENT DOCUMENTS

| | | | |
|---|---|---|---|
| 6,353,318 | B1 | 3/2002 | Sin et al. |
| 6,542,343 | B1 | 4/2003 | Gill |
| 6,759,081 | B2 | 7/2004 | Huganen et al. |
| 7,057,859 | B2 | 6/2006 | Kagami et al. |
| 7,443,635 | B2 | 10/2008 | Tanaka et al. |
| 7,652,857 | B2 | 1/2010 | Sato |
| 2004/0150922 | A1 | 8/2004 | Kagami et al. |
| 2007/0080381 | A1 | 4/2007 | Chien et al. |
| 2008/0112080 | A1 | 5/2008 | Lengsfield et al. |
| 2009/0059443 | A1 | 3/2009 | Tsuchiya et al. |
| 2009/0085058 | A1* | 4/2009 | Mather et al. ................. 257/104 |
| 2009/0086383 | A1 | 4/2009 | Hara et al. |
| 2009/0091863 | A1 | 4/2009 | Hosotani et al. |
| 2010/0002336 | A1 | 1/2010 | Sun et al. |
| 2010/0053821 | A1 | 3/2010 | Watanabe et al. |

FOREIGN PATENT DOCUMENTS

JP 2004165224 6/2004

OTHER PUBLICATIONS

Childress, Jeffrey R., et al., "Magnetic recording head sensor technology," Comptes Rendus Physique vol. 6 (2005), pp. 997-1012.

* cited by examiner

*Primary Examiner* — Phuc Dang
(74) *Attorney, Agent, or Firm* — Guadalupe M. Garcia

(57) ABSTRACT

The present invention provides a method for manufacturing a TMR sensor that reduces damage to a sensor stack during intermediate stages of the manufacturing process. In an embodiment of the invention, after formation of a sensor stack, a protective layer is deposited on the sensor stack that provides protection from materials that may be used in subsequent steps of the manufacturing process. The protective layer is subsequently converted to an insulating layer and the thickness of the insulating layer is extended to an appropriate thickness. In converting the protective layer to an insulating layer, the sensor stack is not directly exposed to materials that may damage it. For example, in an embodiment of the invention, Mg is used as the protective layer that is subsequently converted to MgO with the introduction of oxygen. Although direct contact of oxygen with the sensor stack may cause damage to the sensor stack, direct contact is avoided by the present invention. Subsequently, the thickness of the insulating layer, in this example can be extended to an appropriate thickness without exposing the sensor stack to damage causing oxygen and inter-diffusion.

23 Claims, 7 Drawing Sheets

METHOD FOR JUNCTION ISOLATION TO REDUCE JUNCTION DAMAGE FOR A TMR SENSOR

FIELD OF THE INVENTION

The present invention relates to the manufacture of TMR sensors. More particularly, the present invention relates to the fabrication of certain insulating layers in a manner that reduces damage to a sensor stack during manufacture.

BACKGROUND OF THE INVENTION

Hard-disk technology is constantly evolving. In hard drive technology, the sensor that detects magnetic information on a rotating disk has played an important role. Today's sensors are drastically different from those used even a few years ago. For example, modern sensors can detect and transmit information from recorded data at densities greater than 200 Gbit/in$^2$ and data rates approaching 1 GHz. Advances in nanomagnetics, magnetic ultrathin films, magneto-electronics, as well as device processing, have advanced this technology. It can be expected that the future will continue to bring advances in sensor technology.

The read sensor in the recording head of hard-disk drives (HDD), based on the phenomenon of giant magnetoresistance (GMR), is an example of the commercialization of magnetic nanotechnology and spintronics. The basic magnetoresistive film can be composed of a dozen or more layers of magnetic and non-magnetic materials whose effective thickness is controlled down to sub-Angstrom level. Each of these layers directly determines or affect the magnetic and magnetotransport behavior.

From this multilayer, a working sensor and head are created after, for example, over 250 processing steps, using techniques that are near the limits of current lithography, combining insulating and conducting materials, hard magnet biasing, and magnetic shielding. The sensor is designed to fly just a few nanometers above a spinning disk at up to 15000 revolutions per minute.

The recording head has three main components: (1) the read sensor ("reader"); (2) the write transducer ("writer"), which is a microfabricated planar electromagnet with a narrow pole that creates a high density of magnetic flux in proximity to the media; and (3) the slider, which is a shaped piece of substrate (typically alumina-titanium carbide) onto which the writer and read sensor are built, and is engineered to "fly" only a few nanometers above the spinning media disk.

The subject of the present invention is the read sensor but it is understood that for any sensor, there is an appropriate combination of writer and slider which forms a coherent recording head device and, together with the chosen media, mechanical characteristics, and electronics, forms a complete recording system. The recording environment in which the head is expected to operate is first introduced, including media characteristics, magnetic interference and shielding, and signal-to-noise (SNR) considerations. These constraints put specific boundaries on the sizes, geometries, and magnetic properties which a read sensor must achieve.

The magnetic recording process utilizes a thin film transducer for the creation or writing of magnetized regions (bits) onto a thin film disk and for the detection or reading of the presence of transitions between the written bits. The thin film transducer is referred to as a thin film head. It consists of a read element, which detects the magnetic bits, and a write element, which creates or erases the bits.

FIG. 1 is a schematic of the recording process. Shown in FIG. 1 is read sensor 102, write element 104, and recording medium 106. The perpendicular write element 104 writes magnetic transitions vertically within recording medium 106 by orienting the write field perpendicular to the direction of the recording film surface. The magnetic field created by this perpendicular head returns to this element through a magnetically soft underlayer 110 within the medium, or return path. In this way the recording medium 106 lies within the write gap. The resulting perpendicular write fields can be up to two times larger than longitudinal write fields, thus enabling the perpendicular write element to write information on high coercivity media that is inherently more thermally stable. In perpendicular recording, the bits do not directly oppose each other resulting in a significantly reduced transition packing. This allows bits to be more closely packed with sharper transition signals, facilitating easier bit detection and error correction. During a read operation, read sensor 102 detects perpendicular bits 108 on recording medium 106.

In a disk recording system, successive bits are written onto the disk surface in concentric rings or tracks separated by a guard band. The head transducer is attached to a suspension, and the suspension is attached to an actuator which controls the position of the transducer in a plane above the disk surface. A specially-designed topography on the lower surface of the slider (known as the air-bearing surface or ABS) allows the head to "fly" above the rotating disk (typically 4200-15000 rpm), and controls the height of the transducer above the disk surface, typically 10 to 15 nm.

Referring now to FIG. 2, there is shown an implementation of a disk drive 200. As shown in FIG. 2, at least one rotatable magnetic disk 212 is supported on a spindle 214 and rotated by a disk drive motor 218. The magnetic recording on each disk is in the form of annular patterns of concentric data tracks on the magnetic disk 212.

At least one slider 213 is positioned near the magnetic disk 212, each slider 213 supporting one or more magnetic head assemblies 221. As the magnetic disk rotates, slider 213 moves radially in and out over the disk surface 222 so that the magnetic head assembly 221 may access different tracks of the magnetic disk where desired data are written. Each slider 213 is attached to an actuator arm 219 by way of a suspension 215.

Suspension 215 provides a spring force which biases slider 213 against disk surface 222. Each actuator arm 219 is attached to actuator 227. Actuator 227 as shown in FIG. 2 may be a voice coil motor (VCM). The VCM comprises a coil movable within a fixed magnetic field, the direction and speed of the coil movements being controlled by the motor current signals supplied by controller 229.

During operation of the disk storage system, the rotation of magnetic disk 212 generates an air bearing between slider 213 and the disk surface 222 which exerts an upward force or lift on the slider. The air bearing thus counter-balances the spring force of suspension 215 and supports slider 213 off and slightly above the disk surface by a small, substantially constant spacing during normal operation.

The various components of the disk storage system are controlled in operation by control signals generated by control unit 229. Control signals may also include internal clock signals. Typically, control unit 229 comprises logic control circuits, digital storage and a microprocessor. Control unit 229 generates control signals to control various system operations such as drive motor control signals on line 223 and head position and seek control signals on line 228. The control signals on line 228 provide the desired current profiles to optimally move and position slider 213 to the desired data track on disk 212. Write and read signals are communicated to and from write and read heads 221 by way of recording channel 225.

With reference to FIG. 3, the orientation of magnetic head 221 in slider 213 can be seen in more detail. FIG. 3 is an ABS view of slider 213, and as can be seen, the magnetic head, including an inductive write head and a read sensor, is located at a trailing edge of the slider. The above description of a typical magnetic disk storage system, and the accompanying illustrations of FIG. 1-3 are for representation purposes only. It should be apparent that disk storage systems may contain a large number of disks and actuators, and each actuator may support a number of sliders.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \theta$, where $\theta$ is the angle between the magnetizations of the pinned and free layers. In a read mode, the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer).

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Magnetization of the pinned layer is usually fixed by exchange coupling one of the ferromagnetic layers (AP1) with a layer of antiferromagnetic material such as PtMn or IrMn. While an antiferromagnetic (AFM) material such as PtMn or IrMn does not in and of itself have a magnetization, when exchange coupled with a magnetic material, it can strongly pin the magnetization of the ferromagnetic layer.

In order to meet the ever increasing demand for improved data rate and data capacity, research has focused on the development of perpendicular recording systems. A traditional longitudinal recording system stores data as magnetic bits oriented longitudinally along a track in the plane of the surface of the magnetic disk. This longitudinal data bit is recorded by a fringing field that forms between a pair of magnetic poles separated by a write gap.

A perpendicular recording system, on the other hand, records data as magnetic transitions oriented perpendicular to the plane of the magnetic disk. The magnetic disk has a magnetically soft underlayer covered by a thin magnetically hard top layer. The perpendicular write head has a write pole with a very small cross section and a return pole having a much larger cross section. A strong, highly concentrated magnetic field emits from the write pole in a direction perpendicular to the magnetic disk surface, magnetizing the magnetically hard top layer. The resulting magnetic flux then travels through the soft underlayer, returning to the return pole where it is sufficiently spread out and weak that it will not erase the signal recorded by the write pole.

The advent of perpendicular recording systems has lead to an increased interest in Current perpendicular to plane (CPP) sensors, which are particularly suited to use in perpendicular recording systems, due to their ability to meet higher linear density requirements. A CPP sensor differs from a more conventional current in plane (CIP) sensor such as that discussed above in that the sense current flows through the CPP sensor from top to bottom in a direction perpendicular to the plane of the layers making up the sensor. Whereas the more traditional CIP sensor has insulation layers separating it from the shields, the CPP sensor contacts the shields at its top and bottom surfaces, thereby using the shields as leads.

One type of CPP sensor is a tunnel valve or tunnel magnetoresitive (TMR) sensor. Such sensors have a magnetic free layer and a magnetic pinned layer similar to a GMR or spin valve. The tunnel valve, however, has a thin electrically insulating barrier layer sandwiched between the free and pinned layers rather than an electrically conductive spacer layer. To meet the demands for increased sensor performance, researchers have sought to develop TMR sensors having improved performance characteristics. A theoretical improvement has been reported by constructing a TMR sensor having an Fe free layer, an Fe pinned layer and a MgO barrier formed therebetween. Such a construction has been proposed by Wulfhekel et al. in Applied Physics Letters, vol. 78, no. 4, 22 Jan. 2002.

During the manufacture of TMR sensors, however, it has been observed that damage to the sensor stack can occur with the introduction of oxygen during the formation of certain insulating layers. The damage to the sensor stack has analyzed to detrimentally affect the performance of the TMR sensor.

Therefore, there is a need for a practical CPP magnetoresistive sensor having exceptional magnetoresistive performance. More particularly, there is a need for a TMR sensor having consistent performance where such performance is not compromised by damage incurred during its manufacture.

SUMMARY OF THE INVENTION

The present invention includes, among other things, an improved method for manufacturing a TMR sensor. In particular, the present invention provides a method for manufacturing a TMR sensor that reduces damage to a sensor stack during intermediate stages of the manufacturing process.

In an embodiment of the invention, after formation of a sensor stack, a protective layer is deposited on the sensor stack that provides protection from materials that may be used in subsequent steps of the manufacturing process. The protective layer is subsequently converted to an insulating layer and the thickness of the insulating layer is extended to an appropriate thickness.

In converting the protective layer to an insulating layer, sensor stack is not directly exposed to materials that may damage it. For example, in an embodiment of the invention, Mg is used as the protective layer that is subsequently converted to an insulating MgO with the introduction of oxygen. Although direct contact of oxygen with the sensor stack may cause damage to the sensor stack, direct contact is avoided by the present invention. Instead, the Mg protective layer is converted to a first insulating layer MgO without having oxygen come in contact with the sensor stack. Subsequently, the thickness of the first insulating layer, in this example, MgO, can be extended to an appropriate thickness by depositing a second insulating layer without exposing the sensor stack to damage causing oxygen.

In an embodiment of the invention, the second insulating layer is MgO. In another embodiment of the present invention, AlO is used as the second insulating layer. In yet another embodiment of the invention, Al is used as the protective layer that is subsequently converted to the metal oxide AlO.

The present invention is not limited to the use of the metals Mg or Al as the protective layers, nor the metal oxides MgO or AlO as the insulating layers. Indeed, various metal/metal oxide combinations are disclosed.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

The following drawings will be used to more fully describe embodiments of the present invention.

DETAILED DESCRIPTION OF THE INVENTION

The following description is of certain preferred embodiments presently contemplated for carrying out this invention. This description is made for the purpose of illustrating the general principles of this invention and is not meant to limit the inventive concepts claimed herein.

The present invention will be described with reference to FIGS. 4-7 where reference numbers will be used to refer to various structures. It should be understood that where the same numbers are used amongst the figures the same or substantially the same structure is referenced.

For clarity of descriptions, sensor 400 will first be described with reference to FIG. 4 after which improvements for the fabrication of sensor 400 will be described with reference to FIGS. 5-7.

Figure 1:
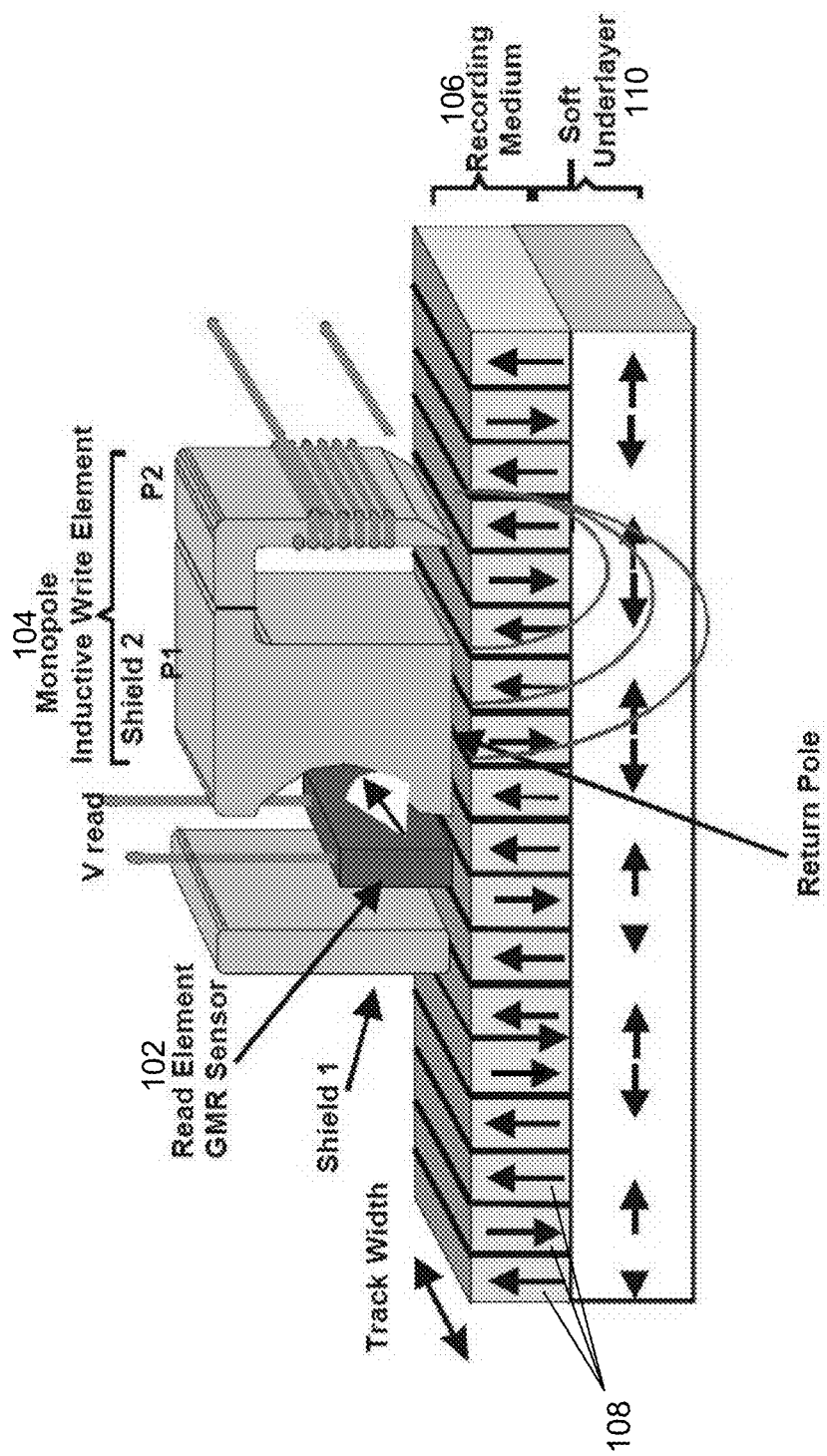
FIG. 1 is schematic illustration of a disk drive reader and sensor.
Figure 2:
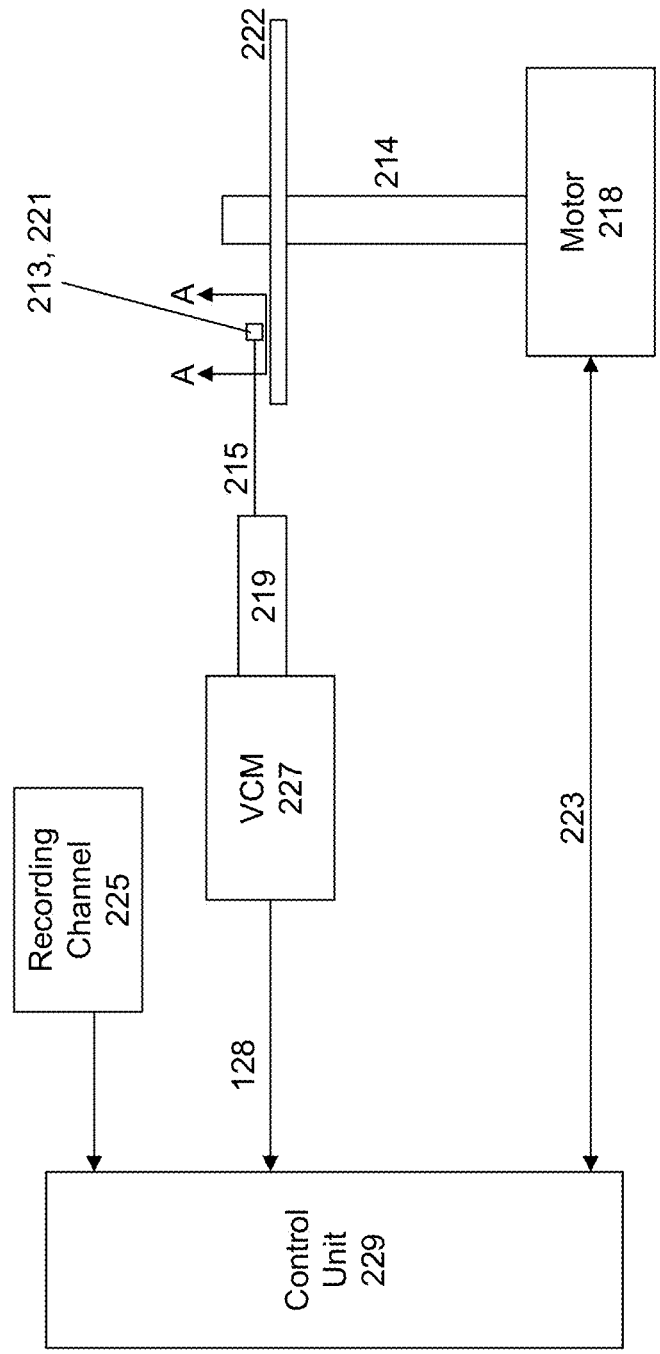
FIG. 2 is a schematic illustration of a disk drive system in which the invention might be embodied.
Figure 3:
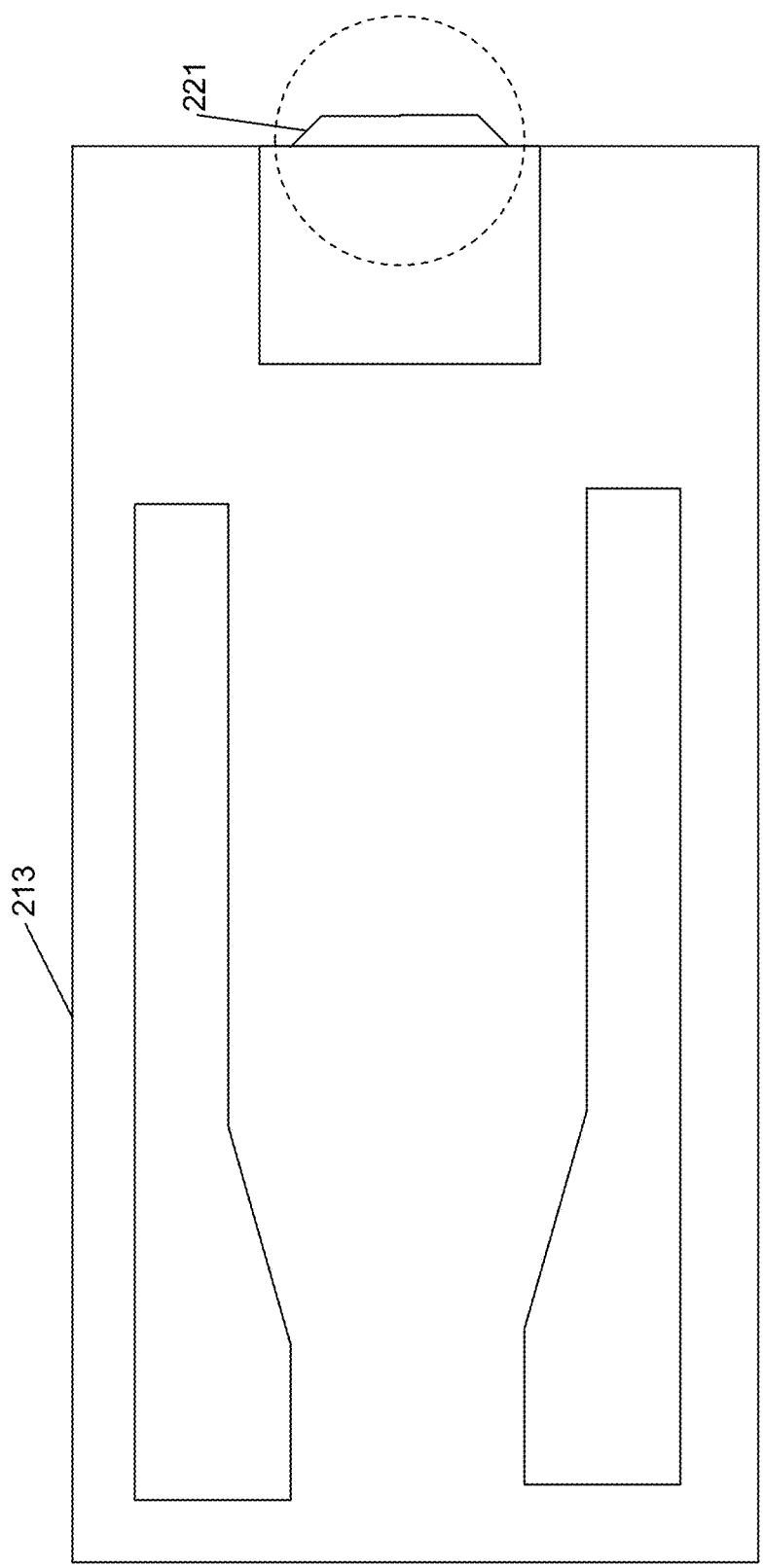
FIG. 3 is an ABS view of a slider illustrating the location of a magnetic head thereon.
Figure 4:
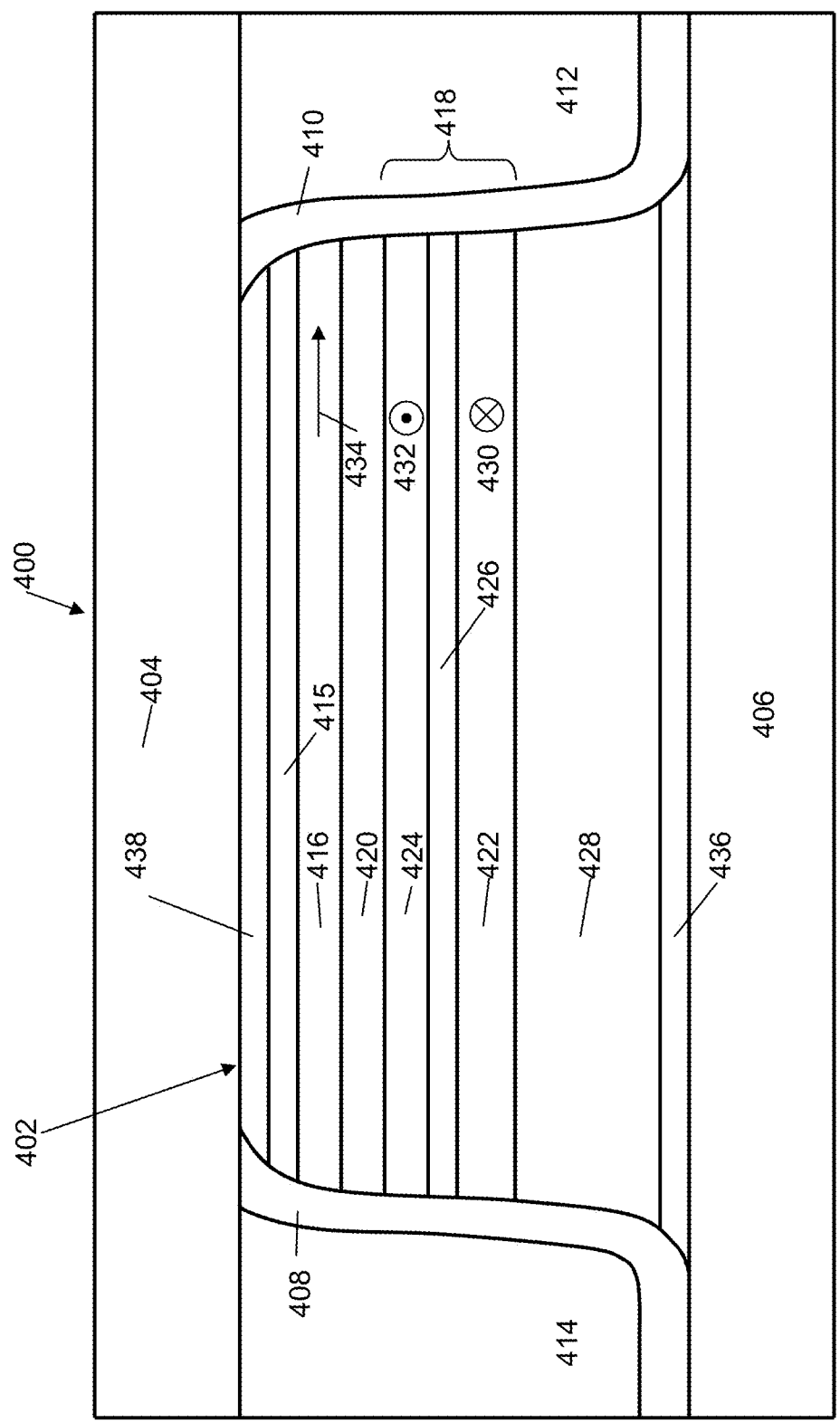
FIG. 4 is an illustration of a hard disk drive sensor according to an embodiment of the invention.

With reference now to FIG. 4, a magnetoresistive sensor 400 according to an embodiment of the invention includes a magnetoresistive sensor element or sensor stack 402, layered between first and second leads 404 and 406. First and second leads 404 and 406 can be constructed of an electrically conductive, magnetic material such as NiFe and can thereby serve as magnetic shields as well as leads. In addition, first and second hard magnetic bias layers 412 and 414 are preferably provided at either side of the sensor to provide magnetic biasing for the free layer. Sensor stack 402 includes a magnetic free layer 416 and a magnetic pinned layer structure 418 with a spacer/barrier layer 420 therebetween.

Sensor 400 is shown as a tunnel valve or tunnel junction magnetoresitive sensor (TMR) where layer 420 is a non-magnetic, electrically insulating barrier layer formed between free and pinned layers 416 and 418. Insulation layers 408 and 410 are formed at the sides of the sensor stack 402 and extend over at least one of the leads 404 or 406.

Free layer 416 includes a layer of CoFe(B) alloys. Free layer 416 may also have other layers, such as a layer of NiFe 415 disposed away from the spacer layer. The pinned layer structure may be one of many types of pinned layers known in the art. For example, the pinned layer structure may be a self pinned, antiparallel (AP) coupled pinned layer and AFM pinned structure. Alternatively, it may be a simple pinned structure having a single magnetic layer exchange coupled with a layer of antiferromagnetic material (AFM) layer.

Layer 420 is a barrier layer that, according to certain embodiments of the present invention that will be discussed further below, prevents the formation of oxide layers in the boundary between the barrier layer 420 and free and pinned layers 416 and 418. Pinned layer structure 418 includes first and second magnetic layers (AP1 and AP2) 422 and 424, respectively, separated by and exchange coupled with a non-magnetic, electrically conductive antiparallel coupling layer (AP coupling layer) 426.

The first magnetic layer 422 preferably comprises CoFe alloy, although other materials or combinations of materials could be used as well. The AP coupling layer 426 could be constructed of many materials such as Ru or Cr. AP coupling layer 426 can be about 4 Å thick to provide good antiparallel coupling of the first and second magnetic layers 422 and 424, respectively. The first magnetic layer AP1 is preferably exchange coupled with antiferromagnetic material (AFM) layer 428.

This exchange coupling with AFM layer 428 strongly pins the magnetic moment 430 of AP1 layer 422 in a first direction perpendicular to the air bearing surface ABS. The strong antiparallel coupling of AP1 and AP2 layers 422 and 424, respectively, strongly sets magnetic moment 432 of AP2 layer 424 in a direction opposite that of layer 430 of AP1 layer 422. Free layer 416 has a magnetic moment 434 that is biased in a direction parallel to the ABS and perpendicular to moments 430 and 432 of pinned layer 418. The biasing for moment 424 of free layer 416 is from magnetostatic coupling with hard bias layers 412 and 414.

With continued reference to FIG. 4, sensor stack 402 may include seed layer 436 disposed at the bottom of the sensor stack 402. Seed layer 436 promotes a desired crystalline growth in subsequently deposited layers providing improved sensor performance. Seed layer 436 can be constructed of for example, Ta/Ru, Fe, NiFe, NiFeCr or some other material or combination of materials.

Sensor stack 402 can also include capping layer 438 formed at the top of sensor stack 402. Capping layer 438 can be constructed of many materials including Ta and Ru and serves to protect the other layers of sensor stack 402 from damage during subsequent manufacturing processes such as annealing.

An exemplary sensor 400 has now been described that can be used in conjunction with the present invention. One of ordinary skill in the art will understand, however, that variations of sensor 400 may also be used with the present invention. The description of sensor 400 is, therefore, provided for illustrative purposes and not as a limitation to the bounds of the present invention.

Figure 5:
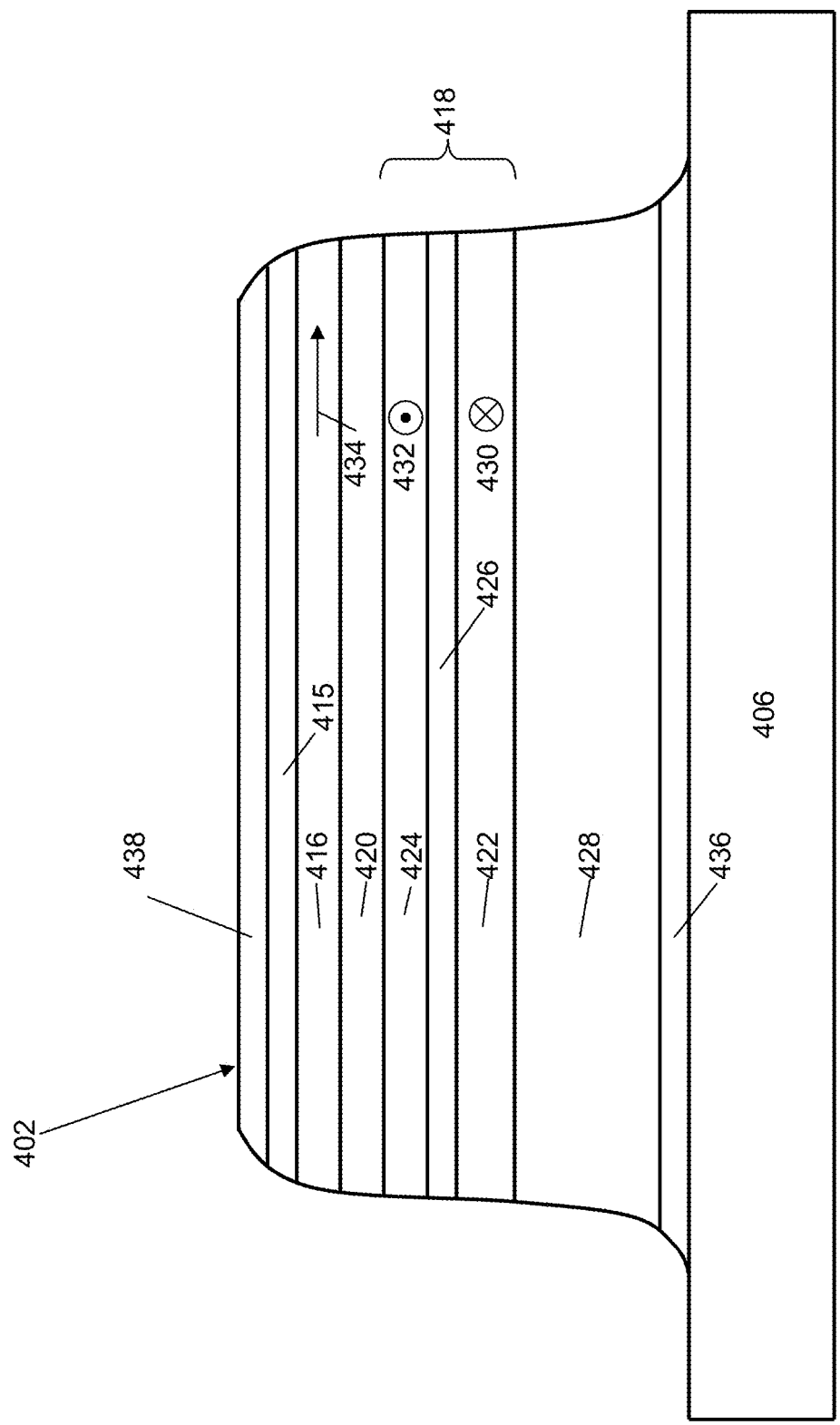
FIG. 5 is an illustration of the manufacture of a hard disk drive sensor according to an embodiment of the invention.
Figure 6:
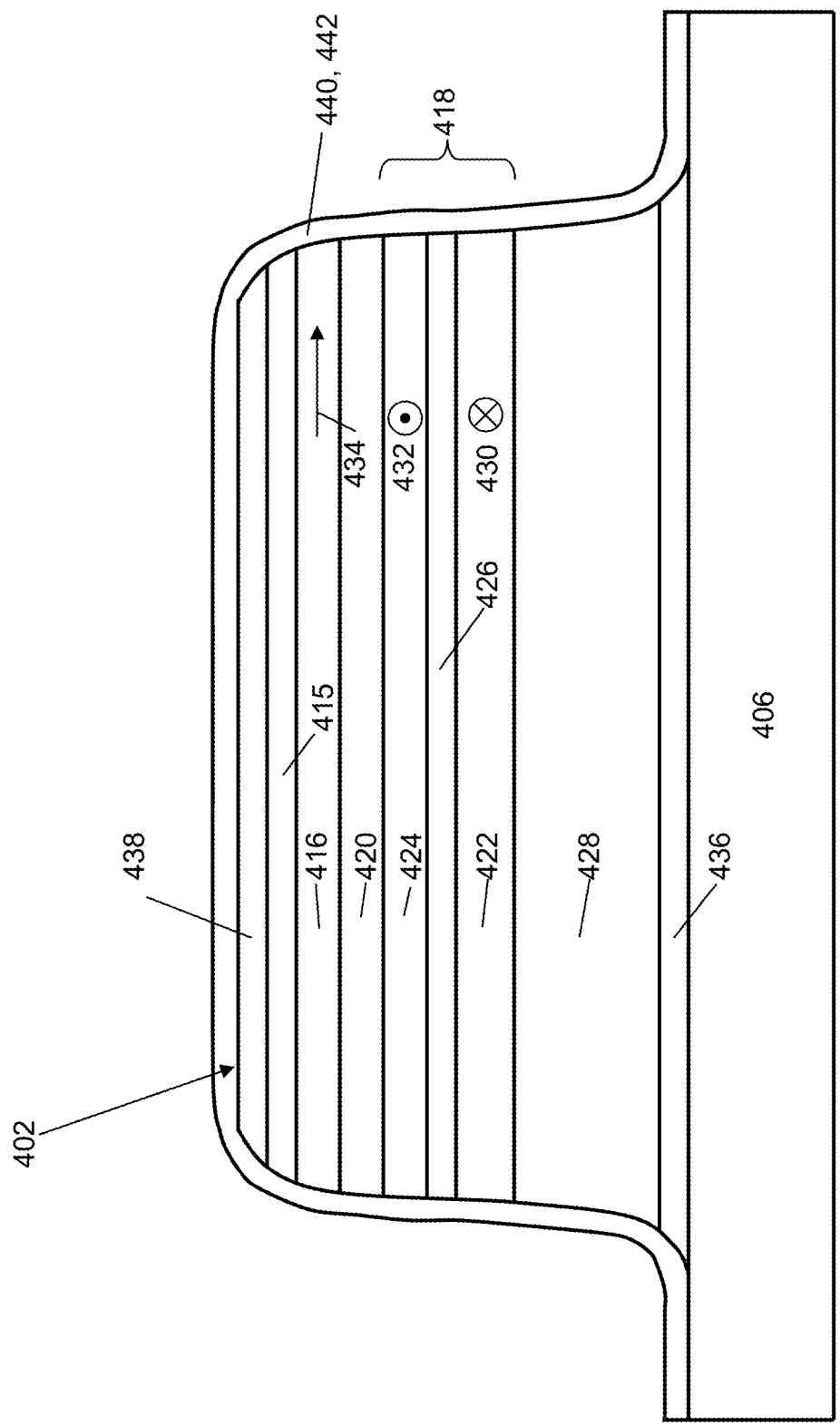
FIG. 6 is an illustration of the manufacture of a hard disk drive sensor according to an embodiment of the invention.
Figure 7:
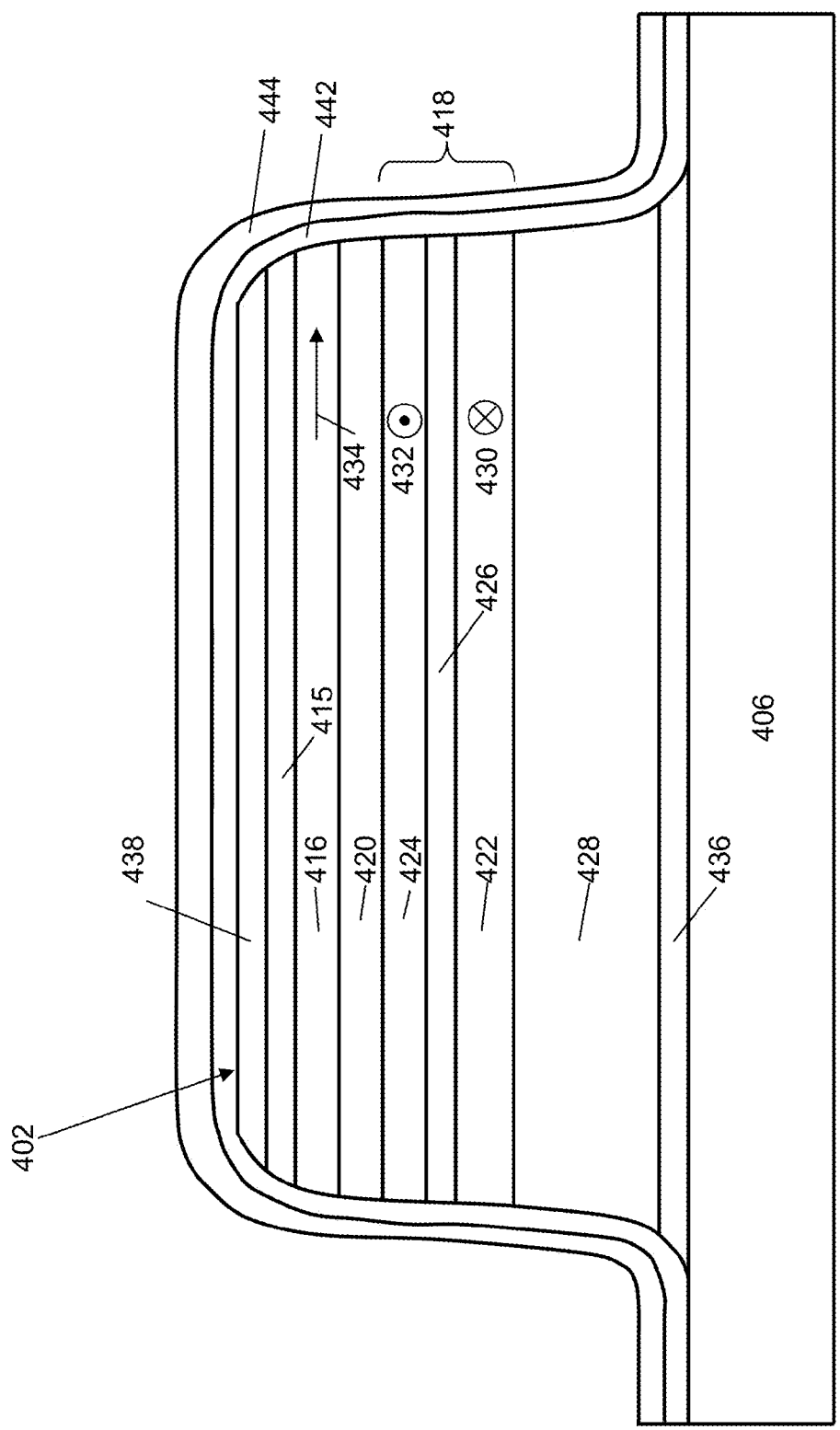
FIG. 7 is an illustration of the manufacture of a hard disk drive sensor according to an embodiment of the invention.

FIGS. 5-7 will now be referenced for improved methods of forming a sensor such as sensor 400, described above.

Shown in FIG. 5 is an intermediate step in the formation of sensor 400. More particularly, FIG. 5 shows sensor stack 402 prior to the formation of insulating layers 408 and 410.

In prior art methods, first and second insulation layers 408 and 410 are typically formed by depositing a metal oxide such as AlO after the formation of sensor stack 402. More particularly in the prior art, both a metal (e.g., Al) and oxygen are introduced in a deposition chamber so as to form insulation layers 408 and 410 of a metal oxide. A disadvantage of the prior art has been that exposure of sensor stack 402 to oxygen leads to damage of sensor stack 402. Damage to sensor stack 402 by oxygen can include physical damage due to the kinetic energy of oxygen as well as reactive damage of oxygen with the materials comprising sensor stack 402.

To address this issue as shown in FIG. 6, an embodiment of the present invention first deposits thin protective layer 440 that is subsequently converted to an insulating layer. Importantly, protective layer 440 is chosen so as to eliminate oxygen or other materials that may damage sensor stack 402. In an embodiment of the invention, the thickness of protective layer 440 is on the order of a few atomic layers, typical less than 10 Å.

For example, in an embodiment of the invention, protective layer 440 is chosen as Mg and deposited on sensor stack 402. Advantageously, Mg is substantially minimally reactive with materials comprising sensor stack 402. In an embodiment of the invention, the thickness of Mg layer 440 is on the order of a few atomic layers, typical less than 10 Å.

After depositing protective layer 440, a reactive material can be introduced into a deposition chamber that converts protective layer 440 into insulating layer 442. For example, where protective layer 440 is chosen as Mg, oxygen can be introduced in a deposition chamber to reactively convert Mg protective layer 440 to MgO insulating layer 442. In doing so, oxygen is prevented from directly contacting sensor stack 402 and is further prevented from diffusing into sensor stack 402. Moreover, where barrier layer 420 is MgO, diffusion of the Mg of Mg layer 440 is minimized.

With reference to FIG. 7 and with insulating layer 442 in place, the thickness of insulating layer 442 can be increased by further depositing insulating layer 444. In an embodiment of the invention, insulating layer 444 is one or multiple layers of dielectric material having composition different or same as insulation layer 442.

For example, where insulating layer 442 is MgO, the deposition of AlO is continued for insulating layer 444. More particularly, with MgO insulating layer 442 in place, the deposition of AlO is continued for insulating layer 442. In an embodiment of the invention, the combined thickness of protective MgO insulating layer 442 and AlO insulating layer 444 is preferably 18 to 30 Å and can depend on their isolation properties and hard bias field strength requirements.

In another embodiment, insulating layer 444 can be made of other dielectric materials including the same material MgO as insulating layer 442, but insulating layer 444 can also be made of a single layer of AlO, TaO, MgO, TiO, ZrO, HfO, ZnO, BN, SiN, SiO, YO, WO, or a combination of layers of these materials. In these embodiments, protective layer 440 and subsequently insulating layer 442 serve to protect sensor stack 402 from the dielectric materials 444 such as AlO, TaO, MgO, TiO, ZrO, HfO, ZnO, BN, SiN, SiO, YO, WO An advantage of the present invention is that protective layer 442 serves to protect sensor stack 402 from physical or reactive damage. For example, where oxygen may be used as part of converting protective layer 442 into an insulation layer or where oxygen may be used as part of the deposition of insulating layer 444, oxygen is prevented from coming in direct contact with sensor stack 402.

Another advantage of the present invention is that protective layer 440 and insulating layer 442 preserve TMR sensor integrity by having reduced interaction with the barrier and free layers.

Another advantage of the present invention is that the flexible combination of protective layer 440, insulating layer 442, and insulating layer 444 having a relatively high dialectic constant preserves isolation material integrity to provide advantageous sidewall shunting. Yet another advantage of the present invention is that the deposition of a metal such as Mg is generally compatible with pre-existing manufacturing processes. For example, the use of a metal such as Mg allows for tool flexibility and further eliminates corrosion of sidewall interaction associated with other processes. The use of other materials similarly provides manufacturing advantages.

Lift off, etching, or CMP techniques can then be used to remove insulating layers 442 and 444 from the top of sensor 402. Sensor 400 of FIG. 4 can then be fabricated as described above. In FIG. 4, insulating layers 408 and 410 comprise the remaining insulating layers 442 and 444 from FIG. 6.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method for forming a tunnel magnetoresitive sensor, comprising:

forming a tunnel magnetoresitive sensor stack;

depositing a first protective layer of a first material upon the tunnel magnetoresitive sensor stack in a deposition chamber;

introducing a second material in the deposition chamber;

converting the first protective layer into a first insulating layer using the second material;

increasing a thickness of the first insulating by introducing at least the first material and the second material into the deposition chamber;

depositing a second insulating layer on the first insulating layer.

2. The method of claim 1, wherein the first protective layer is comprised of Mg.

3. The method of claim 2, wherein the first insulating layer is comprised of MgO.

4. The method of claim 1, wherein the first protective layer is chosen from one of Ti, Ta, Al, Zr, Hf, Zn, B, S, Si, Y, or W.

5. The method of claim 4, wherein the first insulating layer is chosen from one of TiO, TaO, AlO, ZrO, HfO, ZnO, BN, SiN, SiO, YO, or WO.

6. The method of claim 1, wherein second insulating layer is comprised of AlO.

7. The method of claim 1, wherein the second insulating layer is comprised of one of TaO, MgO, TiO$_2$, TaO, AlO, ZrO, HfO, ZnO, BN, SN, SiO, YO, WO.

8. The method of claim 1, wherein the tunnel magnetoresitive sensor stack includes a barrier layer comprised of MgO.

9. The method of claim 1, wherein the tunnel magnetoresitive sensor stack includes a barrier layer comprised of TiO$_2$, TaO, AlO, ZrO, HfO, ZnO, BN, SN, SiO, YO, or WO.

10. The method of claim 1, wherein a thickness of the first protective layer is of a thickness less than 10 Å.

11. The method of claim 1, wherein a combined thickness of the first and second insulating layers is approximately 18-30 Å.

12. The method of claim 1, wherein a combined thickness of the first and second insulating layers is approximately 18-30 Å.

13. The method of claim 1, wherein a thickness of the first protective layer is of a thickness less than 10 Å.

14. A method for forming a tunnel magnetoresitive sensor, comprising:
    forming a tunnel magnetoresitive sensor stack, wherein the tunnel magnetoresitive sensor stack includes a barrier layer comprised of MgO;
    depositing a first protective layer comprising Mg upon the tunnel magnetoresitive sensor stack in a deposition chamber;
    introducing oxygen in the deposition chamber;
    converting the first protective layer into a first insulating layer of MgO;
    increasing a thickness of the first insulating by introducing at least Mg and O into the deposition chamber;
    depositing a second insulating layer on the first insulating layer.

15. The method of claim 14, wherein second insulating layer is comprised of AlO.

16. The method of claim 14, wherein the second insulating layer is comprised of one of TiO$_2$, MgO, TaO, ZrO, HfO, ZnO, BN, SN, SiO, YO, or WO.

17. The method of claim 14, wherein a thickness of the first protective layer is of a thickness of less than 10 Å.

18. A method for forming a tunnel magnetoresitive sensor, comprising:
    forming a tunnel magnetoresitive sensor stack, wherein the tunnel magnetoresitive sensor stack includes a barrier layer;
    depositing a first protective layer comprising a first material X upon the tunnel magnetoresitive sensor stack in a deposition chamber, wherein X is a metal;
    introducing oxygen in the deposition chamber;
    converting the first protective layer into a first insulating layer of the form $X_yO_z$, wherein the subscripts y and z in combination with the elements X and O describe an insulating metal oxide;
    increasing a thickness of the first insulating by introducing at least material X and O into the deposition chamber;
    depositing a second insulating layer on the first insulating layer.

19. The method of claim 18, wherein X is chosen from one of Ti, Ta, Al, Zr, Hf, Zn, B, S, Si, Y, or W.

20. The method of claim 18, wherein $X_yO_z$ is chosen from one of TiO, TaO, AlO, ZrO, HfO, ZnO, BN, SiN, SiO, YO, or WO.

21. The method of claim 18, wherein the second insulating layer is comprised of $X_yO_z$.

22. The method of claim 18, wherein the second insulating layer is comprised of one of TiO$_2$, MgO, TaO, AlO, ZrO, HfO, ZnO, SiO, YO, WO.

23. The method of claim 18, wherein a combined thickness of the first and second insulating layers is approximately 18-30 Å.

* * * * *